(12) United States Patent
Rhodes et al.

(10) Patent No.: US 7,749,798 B2
(45) Date of Patent: Jul. 6, 2010

(54) OPTIMIZED PHOTODIODE PROCESS FOR IMPROVED TRANSFER GATE LEAKAGE

(75) Inventors: Howard E. Rhodes, Boise, ID (US); Richard A. Mauritzson, Boise, ID (US); Inna Patrick, Boise, ID (US)

(73) Assignee: Aptina Imaging Corporation, Grand Cayman (KY)

( * ) Notice: Subject to any disclaimer, the term of this patent is extended or adjusted under 35 U.S.C. 154(b) by 376 days.

(21) Appl. No.: 11/094,363

(22) Filed: Mar. 31, 2005

(65) Prior Publication Data

US 2005/0167708 A1    Aug. 4, 2005

Related U.S. Application Data

(62) Division of application No. 10/689,712, filed on Oct. 22, 2003, now Pat. No. 7,420,233.

(51) Int. Cl.
*H01L 21/00* (2006.01)

(52) U.S. Cl. .......................... 438/75; 438/60; 438/145; 438/302; 438/519; 438/529; 257/E27.133; 257/E21.361; 257/E21.362; 257/E21.617

(58) Field of Classification Search ............... 438/57, 438/73, 69, 200, 302, 185, 194, 231, 232, 438/305–307, FOR. 137, 59, 521, 519, 525, 438/529, 60, 144, 145, 146, 147, 148; 257/290, 257/291, 292, 293, E27.133, E21.361, E21.362, 257/E21.617
See application file for complete search history.

(56) References Cited

U.S. PATENT DOCUMENTS

| | | | | |
|---|---|---|---|---|
| 5,191,399 A | * | 3/1993 | Maegawa et al. | 257/223 |
| 5,595,919 A | * | 1/1997 | Pan | 438/302 |
| 5,719,425 A | * | 2/1998 | Akram et al. | 257/344 |
| 5,793,090 A | * | 8/1998 | Gardner et al. | 257/408 |
| 5,795,813 A | * | 8/1998 | Hughes et al. | 438/423 |
| 5,851,886 A | * | 12/1998 | Peng | 438/289 |
| 6,023,081 A | * | 2/2000 | Drowley et al. | 257/292 |
| 6,127,697 A | | 10/2000 | Guidash | |
| 6,221,686 B1 | | 4/2001 | Drowley et al. | |
| 6,228,674 B1 | | 5/2001 | Pan | |
| 6,258,680 B1 | * | 7/2001 | Fulford et al. | 438/305 |
| 6,291,280 B1 | | 9/2001 | Rhodes | |
| 6,291,289 B2 | | 9/2001 | Rhodes et al. | |
| 6,303,421 B1 | * | 10/2001 | Chang | 438/228 |

(Continued)

OTHER PUBLICATIONS

Stanley Wolf, Silicon Processing for the VLSI Eran, vol. 2: Process Integration, 1990 by Lattice Press, pp. 298-301 and 324-337.*

(Continued)

*Primary Examiner*—Julio J Maldonado
(74) *Attorney, Agent, or Firm*—Dickstein Shapiro LLP (57) ABSTRACT

An image sensing circuit and method is disclosed, wherein a photodiode is formed in a substrate through a series of angled implants. The photodiode is formed by a first, second and third implant, wherein at least one of the implants are angled so as to allow the resulting photodiode to extend out beneath an adjoining gate. Under an alternate embodiment, a fourth implant is added, under an increased implant angle, in the region of the second implant. The resulting photodiode structure substantially reduces or eliminates transfer gate subthreshold leakage.

55 Claims, 9 Drawing Sheets

U.S. PATENT DOCUMENTS

| | | |
|---|---|---|
| 6,307,243 B1 | 10/2001 | Rhodes |
| 6,326,652 B1 | 12/2001 | Rhodes |
| 6,407,417 B1 | 6/2002 | Nagata et al. |
| 6,465,315 B1 * | 10/2002 | Yu .............................. 438/306 |
| 6,489,643 B1 | 12/2002 | Lee et al. |
| 6,521,920 B2 * | 2/2003 | Abe ........................... 257/223 |
| 6,521,925 B1 * | 2/2003 | Mori et al. .................. 257/292 |
| 6,570,201 B2 | 5/2003 | Shim |
| 6,661,459 B1 | 12/2003 | Koizumi et al. |
| 6,690,423 B1 * | 2/2004 | Nakamura et al. .......... 348/311 |
| 6,706,550 B2 | 3/2004 | Lee et al. |
| 6,809,309 B2 | 10/2004 | Kwon |
| 6,869,817 B2 * | 3/2005 | Hwang ........................ 438/48 |
| 2002/0011614 A1 | 1/2002 | Rhodes |
| 2002/0084835 A1 | 7/2002 | Takahashi |
| 2002/0089004 A1 | 7/2002 | Rhodes |
| 2003/0030083 A1 | 2/2003 | Lee et al. |
| 2004/0046192 A1 * | 3/2004 | Lenoble et al. ............. 257/288 |
| 2004/0046193 A1 | 3/2004 | Park et al. |
| 2004/0063262 A1 * | 4/2004 | Feudel et al. ............... 438/197 |
| 2004/0080638 A1 * | 4/2004 | Lee ............................. 348/272 |
| 2004/0108502 A1 | 6/2004 | Nakamura et al. |
| 2005/0064613 A1 | 3/2005 | Takeuchi et al. |
| 2005/0087829 A1 | 4/2005 | Merrill et al. |

OTHER PUBLICATIONS

Wolf, et al., Silicon Processing for the VLSI Era, vol. 2: Process Integration, 1990 by Lattice Press, pp. 298-301.*

* cited by examiner

OPTIMIZED PHOTODIODE PROCESS FOR IMPROVED TRANSFER GATE LEAKAGE

CROSS REFERENCE TO RELATED APPLICATIONS

The present application is a divisional of U.S. application Ser. No. 10/689,712, filed on Oct. 22, 2003,now U.S. Pat. No. 7,420,233 the disclosure of which is hereby incorporated by reference in its entirety.

FIELD OF THE INVENTION

The present invention relates to improved photodiodes used in pixels of an image array.

BACKGROUND OF THE INVENTION

CMOS image devices having pixel sensor arrays are well known in the art and have been widely used due to their low voltage operation and low power consumption. CMOS image devices further have advantages of being compatible with integrated on-chip electronics, allowing random access to the image data, and having lower fabrication costs as compared to other imaging technologies. CMOS image devices are generally disclosed for example, in Nixon et al., "256×256 CMOS Active Pixel Sensor Camera-on-a-Chip," IEEE Journal of Solid State Circuits, vol. 31(12) pp. 2046-2050, 1996; Mendis et al., CMOS Active Pixel Image Sensors," IEEE Transactions on Electron Devices, vol. 41(3) pp. 452-453, 1994 as well as U.S. Pat. Nos. 5,708,263, 5,471,515, and 6,291,280, which are hereby incorporated by reference.

Figure 1:
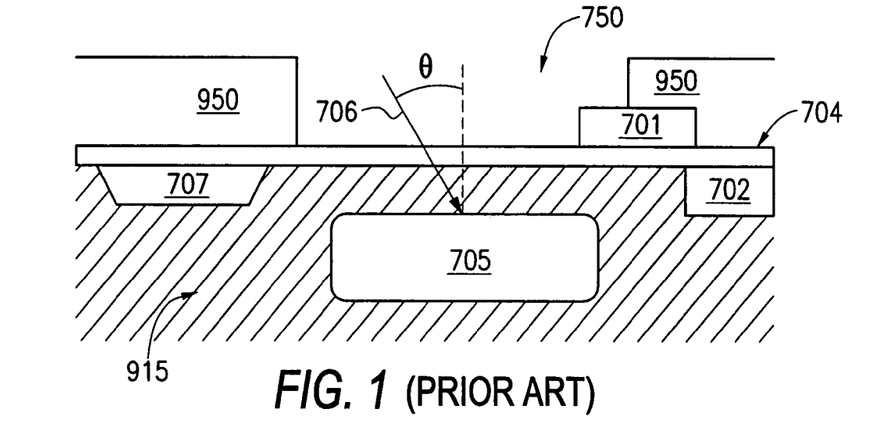
FIG. 1 shows a partially cut away side view of a prior art angled diode implant in a semiconductor imager.

However, conventional CMOS image devices have some significant drawbacks. When photodiode implants are formed within a semiconductor substrate of a pixel cell adjacent a transfer transistor to transfer charge from the photodiode, the resulting structure creates leakage problems beneath the transfer gate, particularly during charge integration, when the transfer transistor is off. FIG. 1 illustrates a prior art pixel cell 750 with a n-type photodiode implant 705 set in a p-type substrate 915, wherein the implant is on one side of transfer gate 701, with a floating diffusion region 702 on the opposite side of gate 701. STI region 707 is an isolation region which isolates one pixel from another. The n-type photodiode implant 705 forms a P-N diode junction above implant 705 with the p-type material which is over implant 705.

Figure 2:
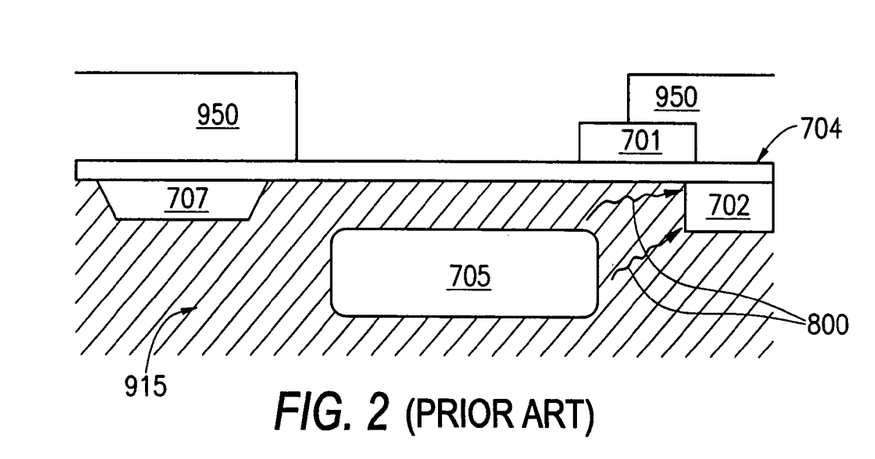
FIG. 2 illustrates the leakage occurring beneath transfer gate 701 in the FIG. 1 arrangement.

The photodiode implant 705 is typically formed using an implant angle θ in order to extend the implant slightly under gate 701 to provide sufficient conductivity between the photodiode n-region 705 and the channel region beneath transfer gate 701. Once implanted, the resulting extended photodiode n-region 705 facilitates transfer of electrons to the channel beneath gate 701 and to the floating diffusion 702 when the gate 701 is on (e.g., a positive voltage applied which is greater than the threshold of the transfer transistor formed by gate 701 and implant regions 702, 705). However, as is shown in FIG. 2, when transfer gate 701 is off, residual charge from n-region 705 leaks in the direction of arrows 800 beneath transfer gate 701 to floating diffusion region 702. This is due to the fact that the shallow angled implant results in a shape for n-region 705, where a portion of the photodiode is in very close proximity to the transfer gate 701. This proximity, while providing a good charge transfer when gate 701 is on, has the unwanted by-product of some undesirable charge leakage when the gate 701 is off. Accordingly, a better photodiode implant which provides good charge transfer when gate 701 is on, while lowering leakage when gate 701 is off is needed.

BRIEF SUMMARY OF THE INVENTION

The present invention provides a CMOS imager having a pixel array in which each pixel has an improved photodiode implant. The photodiode implant is created by tailoring the angle of a plurality of charge collection region implants so that the resulting charge collection region is positioned to provide a good charge transfer characteristic when the transfer transistor gate is on and lowered leakage across the channel region when the transistor gate is off. The photodiode charge collection region is formed through the successive implants into the substrate, some of which are angled, to minimize the barrier and in turn minimize the leakage.

The above and other advantages and features of the invention will be more clearly understood from the following detailed description which is provided in connection with the accompanying drawings.

DETAILED DESCRIPTION OF THE INVENTION

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized, and that structural, logical and electrical changes may be made without departing from the spirit and scope of the present invention.

The terms "wafer" and "substrate" are to be understood as including silicon, silicon-on-insulator (SOI) or silicon-on-sapphire (SOS) technology, doped and undoped semiconductors, epitaxial layers of silicon supported by a base semiconductor foundation, and other semiconductor structures. In addition, the semiconductor need not be silicon-based, but could be based on silicon-germanium, germanium, or gallium arsenide. Furthermore, when reference is made to a "wafer" or "substrate" in the following description, previous process steps may have been utilized to form regions or junctions in the base semiconductor structure or foundation.

The term "pixel" refers to a picture element unit cell containing a photosensor and transistors for converting electromagnetic radiation to an electrical signal. For purposes of illustration, a representative pixel is illustrated in the figures and description herein, and typically fabrication of all pixels in an imager will proceed simultaneously in a similar fashion. The following detailed description is, therefore, not to be taken in a limiting sense, and the scope of the present invention is defined by the appended claims.

Figure 3A:
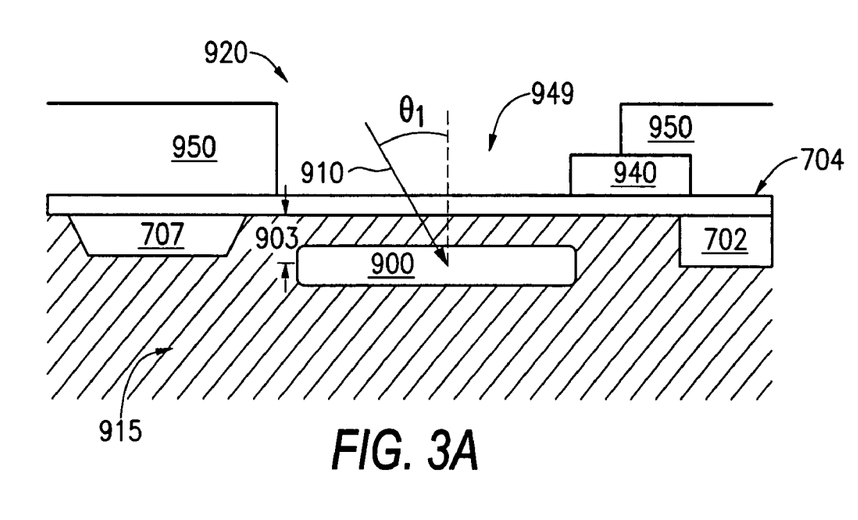
FIG. 3A shows a first reduced-angle diode implant in accordance with a first embodiment of the invention.

Fabrication of a photodiode adjacent a transfer gate in accordance with a first embodiment of the invention will now be described. Referring to FIG. 3A, a portion of a substrate having a p-type doping region 915 is illustrated, where a photodiode will be produced. It is understood that the CMOS imager of the present invention can also be fabricated using n-doped regions in an p-well. A transfer gate stack 940 is fabricated over the substrate region 915. Any LDD source/drain implant associated with region 702 and with other transistors being fabricated on the same structure are performed and a photolithography resist 950 is then applied, having an opening 949 through which a doping implant for a photodiode can pass. The gate stack 940 contains a gate oxide and a conductor, where an insulator is placed over the conductor. The conductor may be formed from material such as polysilicon, silicide, metal, or a combination. The insulator may be formed from material such as oxide, nitride, metal oxide, or a combination.

FIG. 3A illustrates a first n-type diode implant (PD1) 900, formed in p-type substrate 915 through resist opening 949 at a depth indicated as 903, wherein the depth 903 is in the range of 0.1 to 0.7 microns, preferably 0.1-0.5. The dopants for the implant 900 are implanted at an angle $\theta_1$, shown as arrow 910, towards the transfer gate 940. Angle $\theta_1$ is measured away from a line normal to the surface of the sensor, as shown in FIG. 3A. Angle $\theta_1$ for implant 900 is set in the range of 0-30° normal to the surface of sensor 920, preferably at 0-15°. Implant 900 is preferably a low energy implant, where the implant energy used for implant 900 is in the range of 5-200 KeV, preferably less than 100 KeV. The implant dose for implant 900 is in the range of 2E11-1E13/cm², preferably 1E12-6E12/cm².

Figure 3B:
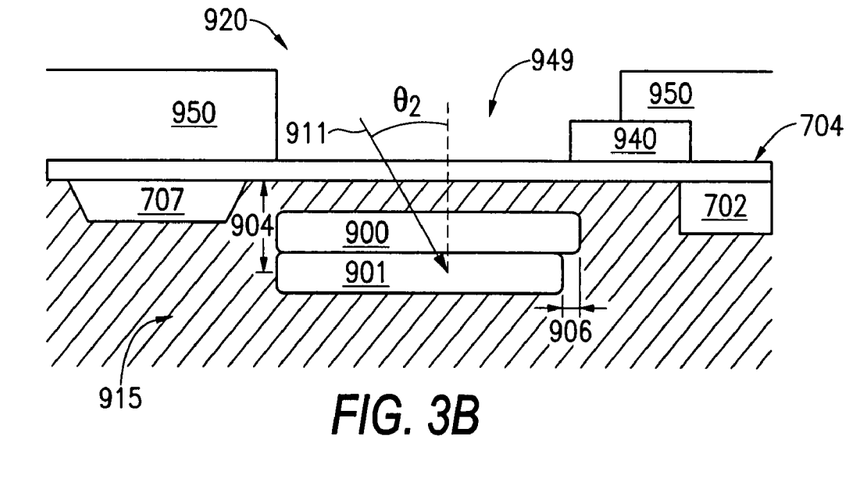
FIG. 3B shows a second reduced-angle diode implant in accordance with the first embodiment of the invention.

FIG. 3B illustrates a second n-type diode implant (PD2) 901, placed in p-type substrate 915 at a depth illustrated as 904, wherein implant 901 may be set forward from implant 900 in the direction of transfer gate 940, by a distance 906 as shown in FIG. 3B. The dopants for the implant 901 are set at an angle $\theta_2$ towards the transfer gate. Angle $\theta_2$ is measured away from a line normal to the surface of the sensor, as shown in FIG. 3B. Angle $\theta_2$ for implant 901 is preferably set in the range of 0-30° normal to the surface of sensor 920, preferably at 0-15°. Implant 901 is preferably a higher energy implant than that used for implant 900, where the implant energy for implant 901 is in the range of 30-300 KeV, preferably 50-250 KeV. The implant dose for implant 901 is in the range of 2E11-1E13/cm², preferably 1E12-6E12/cm².

Figure 3C:
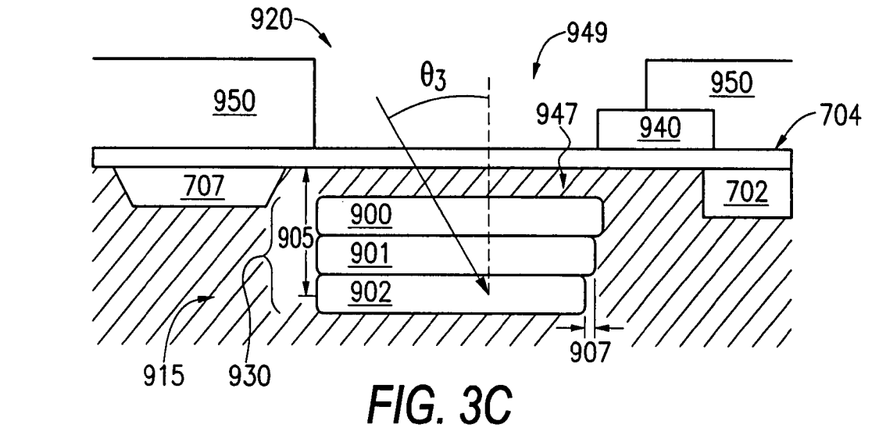
FIG. 3C shows a third reduced-angle diode implant in accordance with the first embodiment of the invention.

FIG. 3C illustrates a third n-type diode implant (PD3) 902, placed in p-type substrate 915 at a minimum depth indicated as 905, wherein implant 902 may be offset from implant 901 by a distance 907 as shown in FIG. 3B. The dopants for the diode are implanted 912 at an angle $\theta_3$ towards the transfer gate. Angle $\theta_3$ is measured away from a line normal to the surface of the sensor, as shown in FIG. 3B. Angle $\theta_3$ for implant 902 is preferably set in the range of 0-30° normal to the surface of sensor 920. Implant 902 is preferably a high energy deep implant, where the implant energy for implant 902 is in the range of 60-500 KeV, preferably 100-400 KeV. The implant dose for implant 902 is in the range of 2E11-1E13/cm², preferably 1E12-6E12/cm². Once formed, the implants (900, 901, 902) of FIGS. 3A-C collectively form an n-type electron collection 930 forming part of a photodiode with a p-type region 947, residing over region 930. Under the illustrations of FIGS. 3A-C, at least one of the implants must be angled.

Figure 3D:
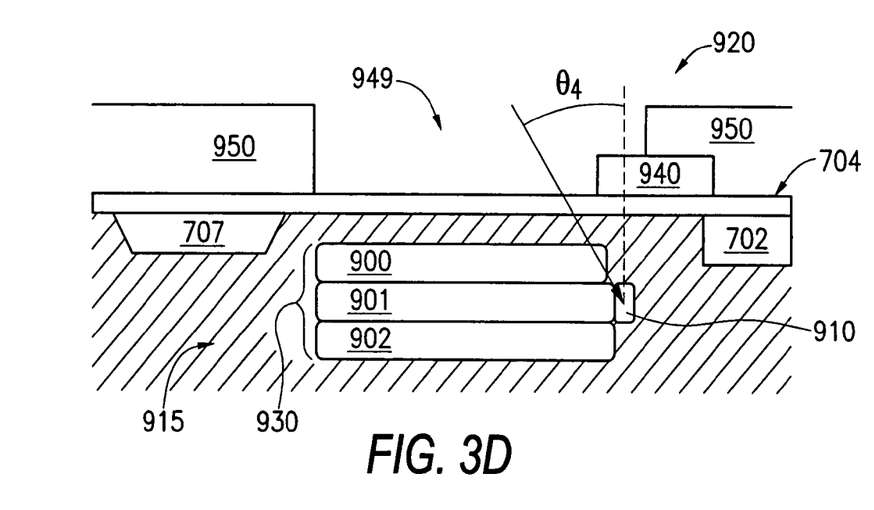
FIG. 3D shows a supplemental implant to the reduced-angle diode implant in accordance with a second embodiment of the invention.

FIG. 3D illustrates an alternate embodiment of the present invention, wherein three implants 900, 901 and 902 are implanted into a p-type substrate 915. The implants 900, 901 and 902, are placed in substrate 915 in a manner similar to that described in the embodiment of FIG. 3A-C, except that the implant angle for each of the implants ($\theta_1$, $\theta_2$, and $\theta_3$) is reduced to a range of 0-5°, where at least one of the implants 901 and 902 has an implant angle greater than 0°. Once the implants have been set, a fourth light implant (PD 4) 910 is made in the region of the second 901 implant, on the side closest to the transfer gate. The fourth implant is inserted 913 at an increased angle $\theta_4$, wherein the implant angle $\theta_4$ is measured away from a line normal to the surface of the substrate, as shown in FIG. 3D, and is preferably in the range of 10-30° of normal. Exemplary implant doses for the fourth implant may be in the range of 2e1/cm²-5e12/cm². It is understood that the order of the implants (900, 901, 902 and 904 (if provided)) is not critical; each of the disclosed implants may be arranged in any order.

Figure 4:
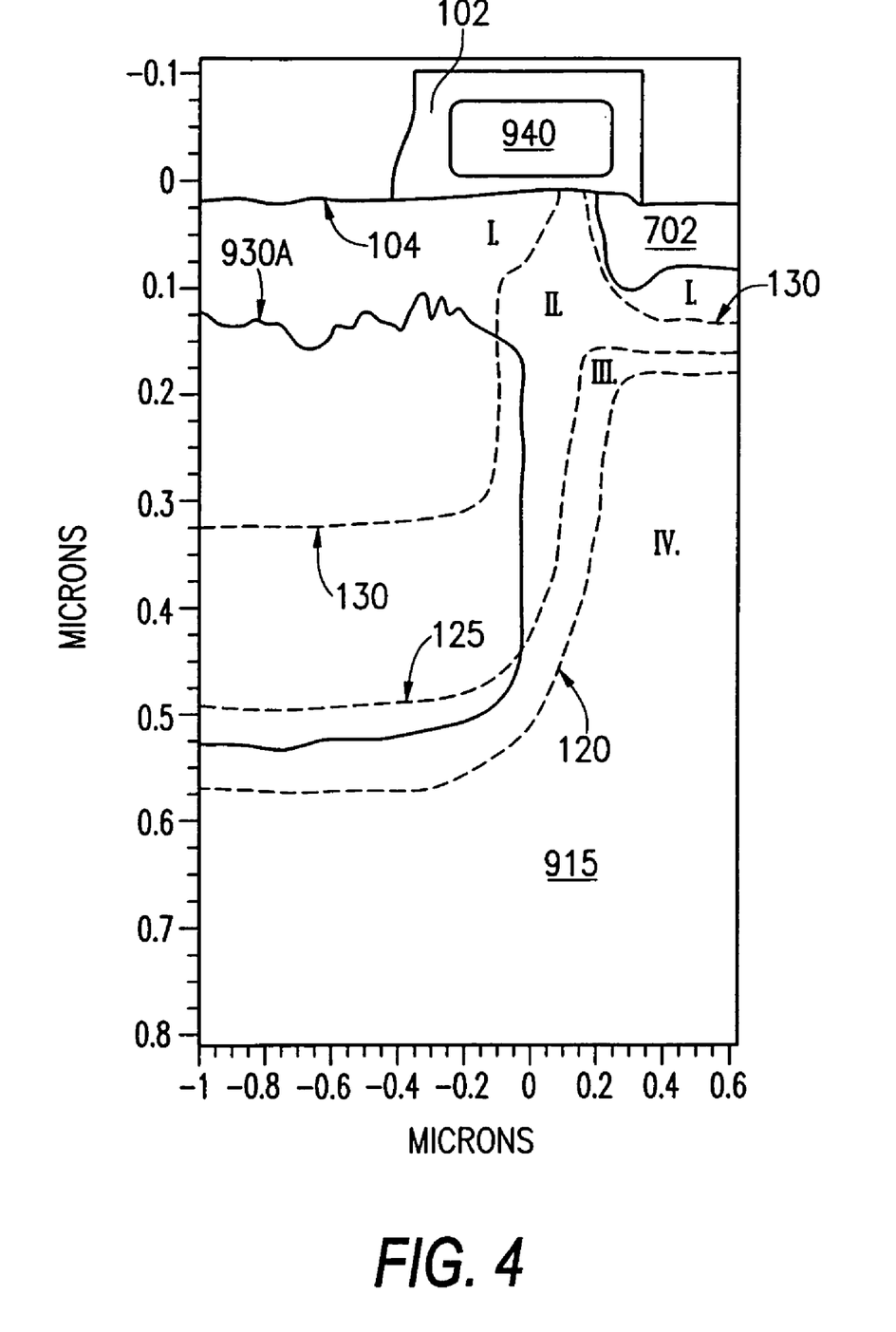
FIG. 4 illustrates an electrostatic potential contour of the diode/transfer gate region formed in a substrate and the donor concentrations in accordance with a third embodiment of the invention.

FIGS. 4-8 show doping profiles in a partially cut away side view of angled diode implants for the implanted photodiode region 930, wherein the various drawings illustrate the dopant concentrations resulting from different exemplary angled implants that may be used. FIG. 4 shows a diode region 930A that is formed in a substrate 915 as a result of the implant methods discussed above in FIG. 3A-C. Specifically, FIG. 4 illustrates a transfer gate 940, surrounded by an insulating layer 102, formed over a substrate 915, which also has an implant n-type floating diffusion region 702. Region 930A represents n-type charge collection region of the photodiode formed in accordance with the three-implant process described above in connection with FIGS. 3A-3C, wherein the implant angles of PD1-PD3 are set at $\theta_1=5°$ for PD1 region 900 (see FIG. 3A), $\theta_2=5°$ for PD2 region 901 (see FIG. 3B), and $\theta_3=30°$ for PD3 region 902 (see FIG. 3C). FIG. 4 also shows four concentration regions (I-IV) that are formed in the substrate as a result of the three implants at the specified implant angles ($\theta_1=5°$, $\theta_2=5°$, and $\theta_3=30°$).

Region I, generally defined by the region above 130 and below regions 104 and floating diffusion 702, has the largest donor concentration between the range of just over 5E16/cm³ to 5E17/cm³. Region II, generally defined by the region between 125 and 130, has a lesser donor concentration between the ranges of just over 5E15/cm³ to 5E16/cm³. Region III, generally defined by the region between 120 and 125, has yet a smaller donor concentration between the ranges of just over 1E14/cm³ to 5E15/cm³. Region IV, generally defined by the region below 120, contains the lowest donor concentration at or below 1E14/cm³. As can be seen from FIG. 4, the reduced donor concentrations found in region II near the transfer gate 940 creates a potential barrier wherein the amount of donor impurities under the transfer gate 940 is reduced. This reduction lessens the occurrence of short-channel effects or punch-through beneath the gate 940.

Figure 5:
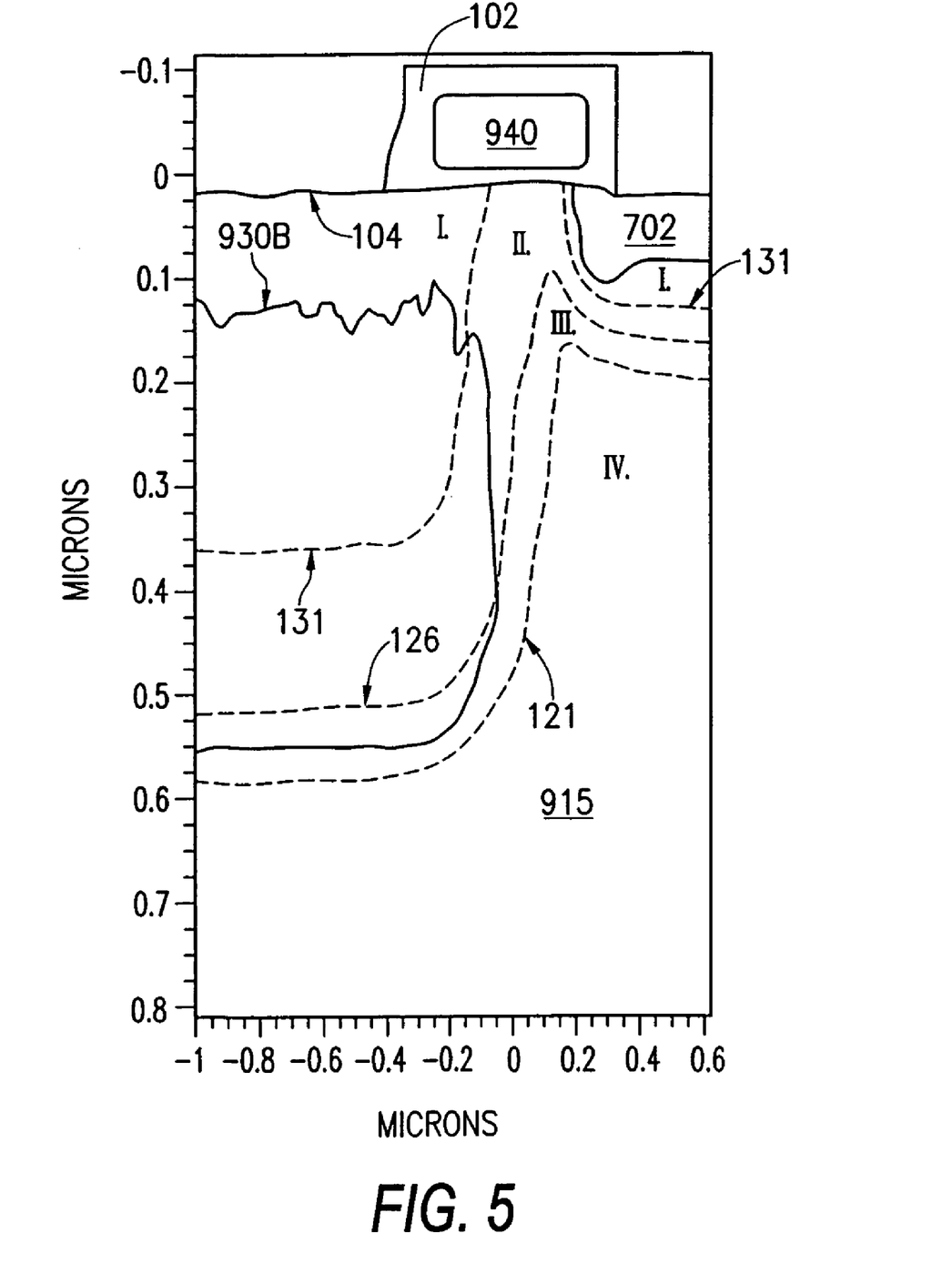
FIG. 5 illustrates an electrostatic potential contour of the diode/transfer gate region formed in a substrate and the donor concentrations in accordance with a fourth embodiment of the invention.

FIG. 5 illustrates region 930B in accordance with another embodiment of the invention. Region 930B in FIG. 5 represents the diode formed subsequent to the three-implant process described above, wherein the implant angles of PD1-PD3 are set at $\theta_1=5°$ for PD1(see FIG. 3A), $\theta_2=5°$ for PD2 (see FIG. 3B), and $\theta_3=15°$ for PD3 (see FIG. 3C). FIG. 5 also shows four concentration regions (I-IV) that are formed in the substrate as a result of the diode region 930B formed by the three implants at the specified implant angles ($\theta_1=5°$, $\theta_2=5°$, and $\theta_3=15°$).

Region I, generally defined by the region above 131 and below regions 104 and floating diffusion 702, has the largest donor concentration between the range of just over $5E16/cm^3$ to $5E17/cm^3$. Region II, generally defined by the region between 126 and 131, has a lesser donor concentration between the ranges of just over $5E15/cm^3$ to $5E16/cm^3$. Region III, generally defined by the region between 121 and 126, has yet a smaller donor concentration between the ranges of just over $1E14/cm^3$ to $5E15/cm^3$. Region IV, generally defined by the region below 121, contains the lowest donor concentration at or below $1E14/cm^3$. As can be seen in the electrostatic potential contour illustration, the reduction of the implant angle $\theta_3$ from 30° to 15° from the previous embodiment has resulted in a wider expansion of Region II from the previous embodiment, directly beneath gate 940, resulting in a further reduction in donor impurities underneath the transfer gate 940.

Figure 6:
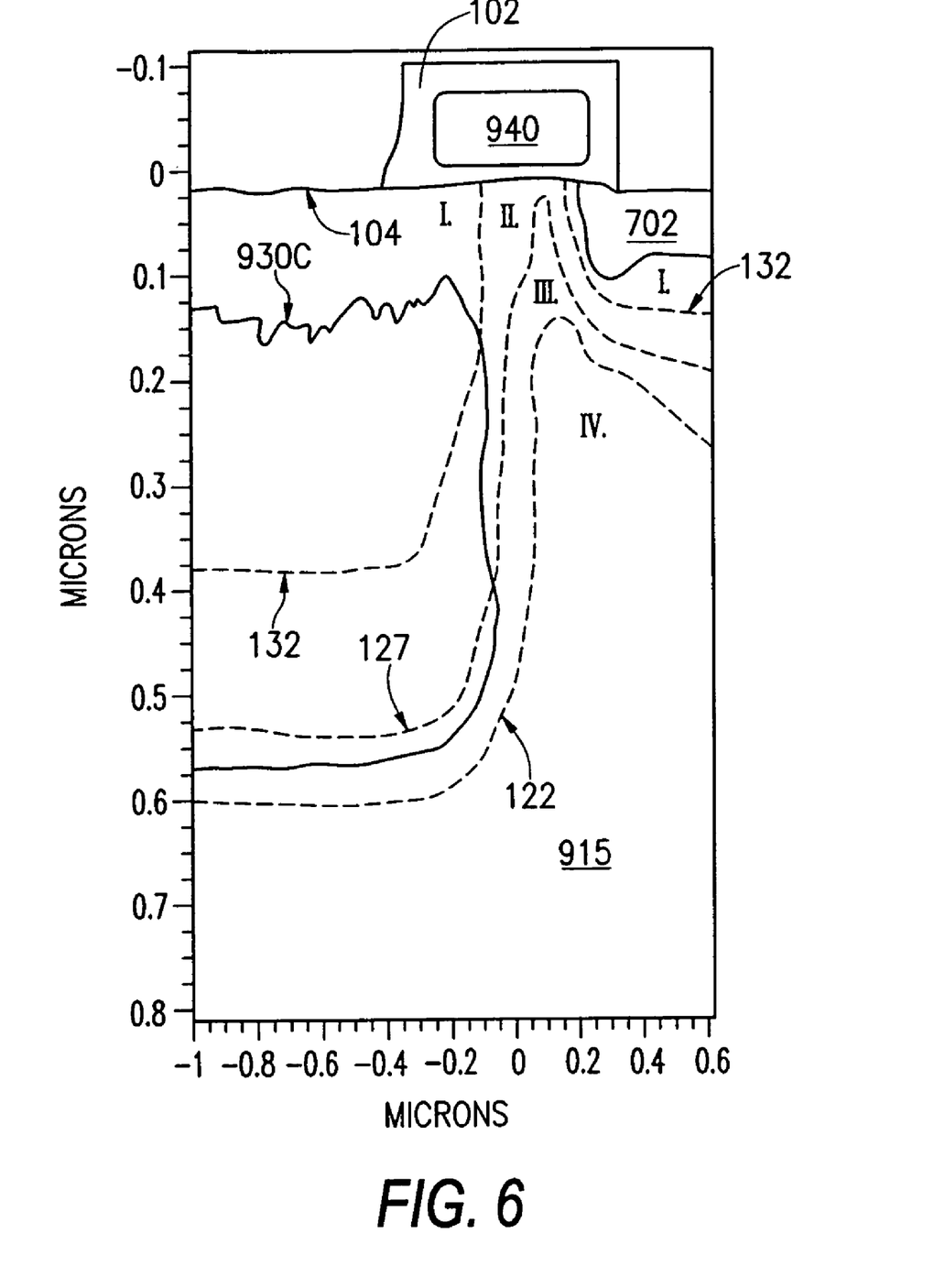
FIG. 6 illustrates an electrostatic potential contour of the diode/transfer gate region formed-in a substrate and the donor concentrations in accordance with a fifth embodiment of the invention.

FIG. 6 illustrates a doping profile in accordance with a third exemplary embodiment of the invention, where a transfer gate 940 is surrounded by a insulating layer 102, formed over a substrate 915, which also having an implanted floating diffusion region 702. Region 930C in FIG. 6 represents the diode region formed subsequent to the three-implant process described above, wherein the implant angles of PD1-PD3 are set at $\theta_1=5°$ for PD1(see FIG. 3A), $\theta_2=30°$ for PD2 (see FIG. 3B), and $\theta_3=5°$ for PD1 (see FIG. 3C). FIG. 6 also shows four concentration regions (I-IV) that are formed in the substrate as a result of the diode region 930C formed by the three implants at the specified implant angles ($\theta_1=5°$, $\theta_2=30°$, and $\theta_3=5°$).

Region I, generally defined by the region above 132 and below regions 104 and floating diffusion 702, has the largest donor concentration between the range of just over $5E16/cm^3$ to $5E17/cm^3$. Region II, generally defined by the region between 127 and 132, has a lesser donor concentration between the ranges of just over $5E15/cm^3$ to $5E16/cm^3$. Region III, generally defined by the region between 122 and 127, has yet a smaller donor concentration between the ranges of just over $1E14/cm^3$ to $5E15/cm^3$. Region IV, generally defined by the region below 122, contains the lowest donor concentration at or below $1E14/cm^3$. As can be seen in the electrostatic potential contour illustration, the reduction of the implant angles $\theta_3$ from 15° to 5°, and the increase of implant angle $\theta_2$ from 5° to 30° from the previous embodiment has resulted in even a wider expansion of Region II from the previous embodiment, directly beneath gat 940, resulting in a further reduction in donor impurities underneath the transfer gate 940.

Figure 7:
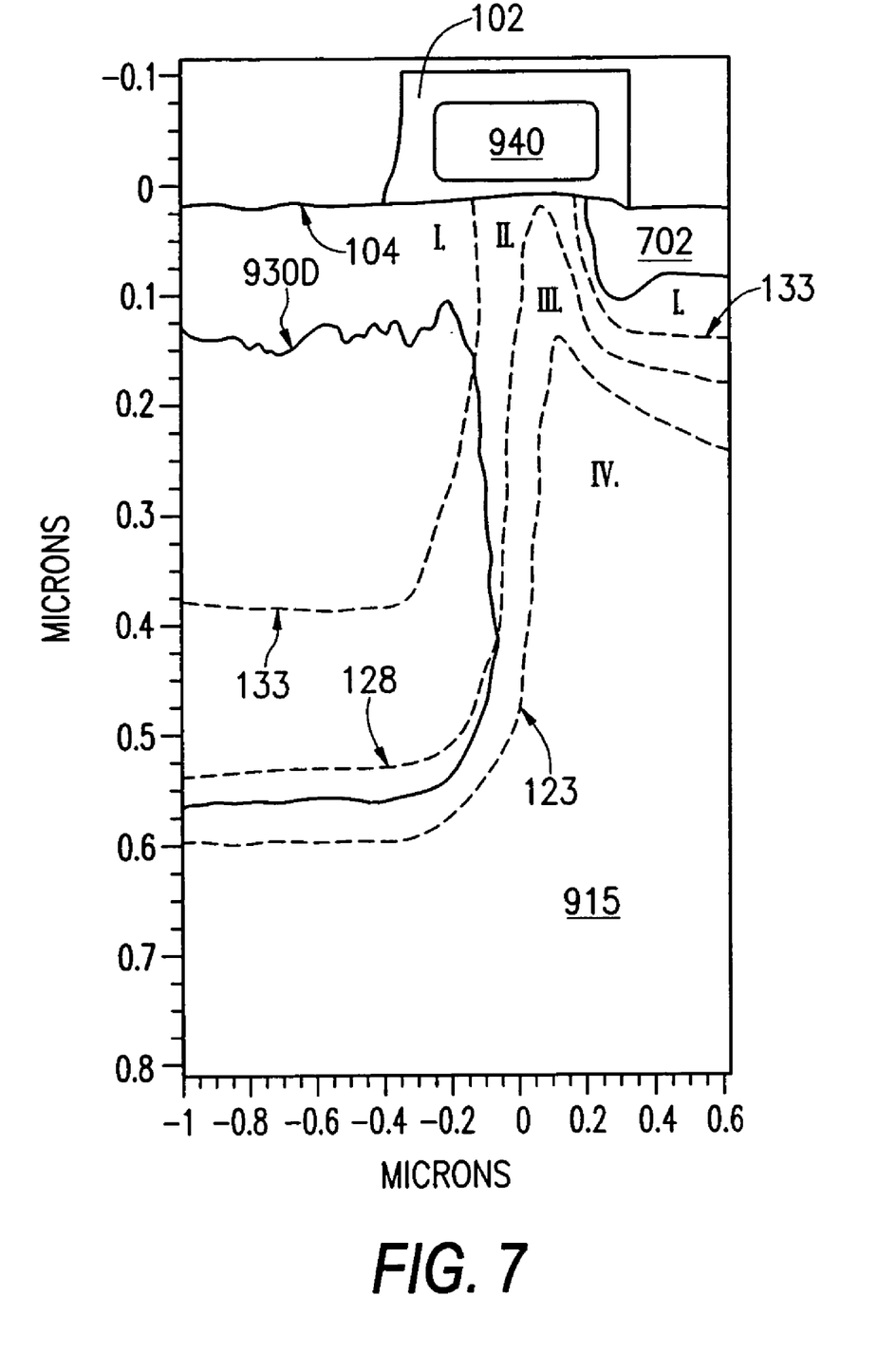
FIG. 7 illustrates an electrostatic potential contour of the diode/transfer gate region formed in a substrate and the donor concentrations in accordance with a sixth embodiment of the invention.

FIG. 7 illustrates a doping profile in accordance with a fourth exemplary embodiment of the invention. Region 930D in FIG. 7 represents the diode formed subsequent to the three-implant process described above, wherein the implant angles of PD1-PD3 are set at $\theta_1=5°$ for PD1(see FIG. 3A), $\theta_2=15°$ for PD2 (see FIG. 3B), and $\theta_3=5°$ for PD1 (see FIG. 3C). FIG. 7 also shows four concentration regions (I-IV) that are formed in the substrate as a result of the diode region 930D formed by the three implants at the specified implant angles ($\theta_1=5°$, $\theta_2=15°$, and $\theta_3=5°$).

Region I, generally defined by the region above 133 and below regions 104 and floating diffusion 702, has the largest donor concentration between the range of just over $5E16/cm^3$ to $5E17/cm^3$. Region II, generally defined by the region between 128 and 133, has a lesser donor concentration between the ranges of just over $5E15/cm^3$ to $5E16/cm^3$. Region III, generally defined by the region between 123 and 128, has yet a smaller donor concentration between the ranges of just over $1E14/cm^3$ to $5E15/cm^3$. Region IV, generally defined by the region below 123, contains the lowest donor concentration at or below $1E14/cm^3$. The reduction of the implant angles $\theta_2$ from 30° to 15° from the previous embodiment resulted in slightly wider expansion of Region II from the previous embodiment, directly beneath gate 940, resulting in a further reduction in donor impurities underneath the transfer gate 940.

Figure 8:
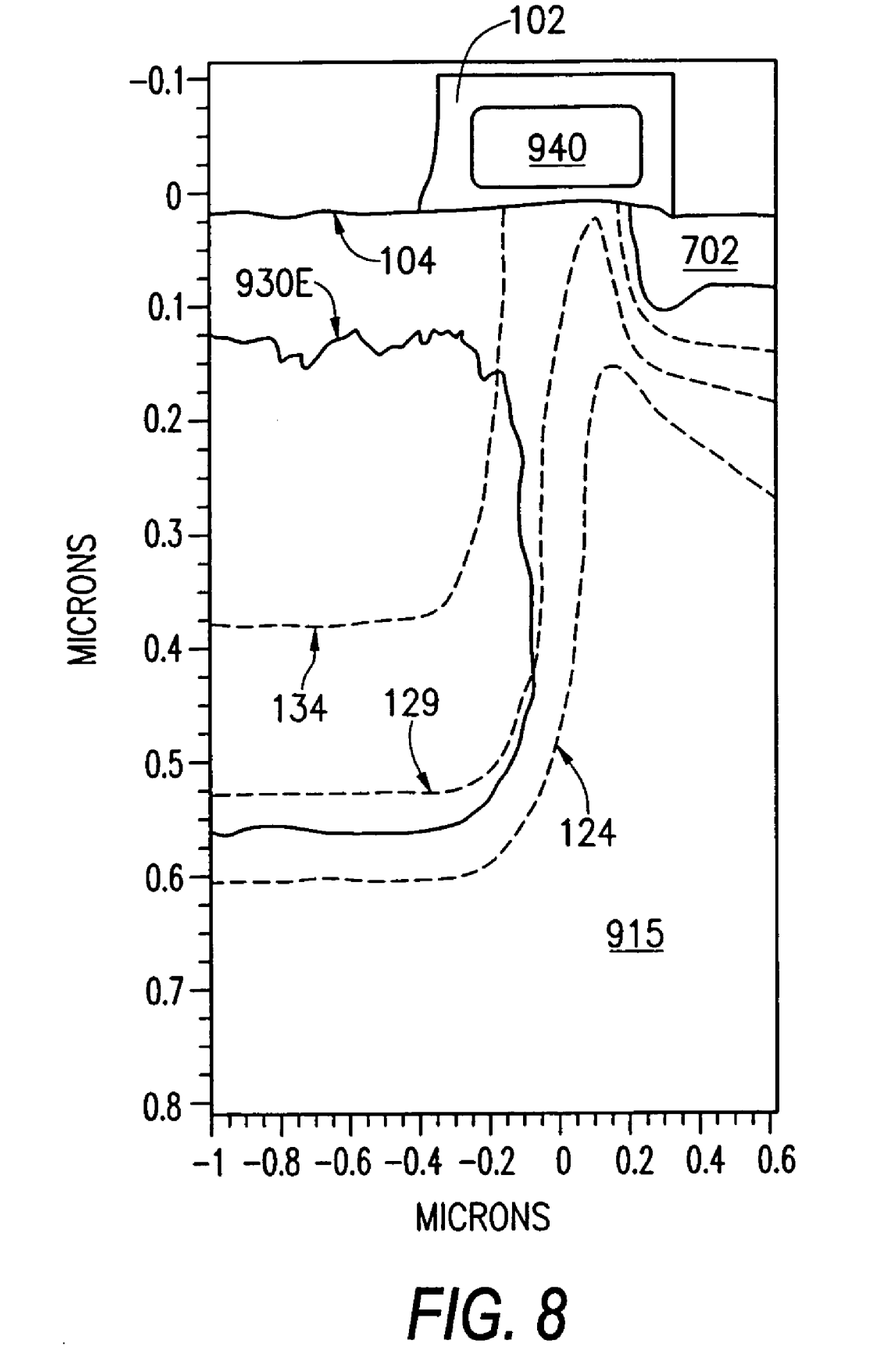
FIG. 8 illustrates an electrostatic potential contour of the diode/transfer gate region formed in a substrate and the donor concentrations in accordance with a seventh embodiment of the invention.

FIG. 8 illustrates a doping profile concentration in accordance with a fifth exemplary embodiment. Region 930E in FIG. 8 represents the diode region formed subsequent to the three-implant process described above, wherein the implant angles of PD1-PD3 are set at $\theta_1=5°$ for PD1(see FIG. 3A), $\theta_2=5°$ for PD2 (see FIG. 3B), and $\theta_3=5°$ for PD1(see FIG. 3C). FIG. 8 also shows four concentration regions (I-IV) that are formed in the substrate as a result of the diode region 930E formed by the three implants at the specified implant angles ($\theta_1=5°$, $\theta2=5°$, and $\theta_3=5°$).

Region I, generally defined by the region above 134 and below regions 104 and floating diffusion 702, has the largest donor concentration between the range of just over $5E16/cm^3$ to $5E17/cm^3$. Region II, generally defined by the region between 129 and 134, has a lesser donor concentration between the range of just over $5E15/cm^3$ to $5E16/cm^3$. Region III, generally defined by the region between 124 and 129, has yet a smaller donor concentration between the range of just over $1E14/cm^3$ to $5E15/cm^3$. Region IV, generally defined by the region below 124, contains the lowest donor concentration at or below $1E14/cm^3$. As can be seen in the electrostatic potential contour illustration, the reduction of the implant angles $\theta_2$ from 15° to 5° from the previous embodiment has further expanded Region II from the previous embodiment, resulting in an even greater reduction in donor impurities underneath the transfer gate 940.

Figure 9:
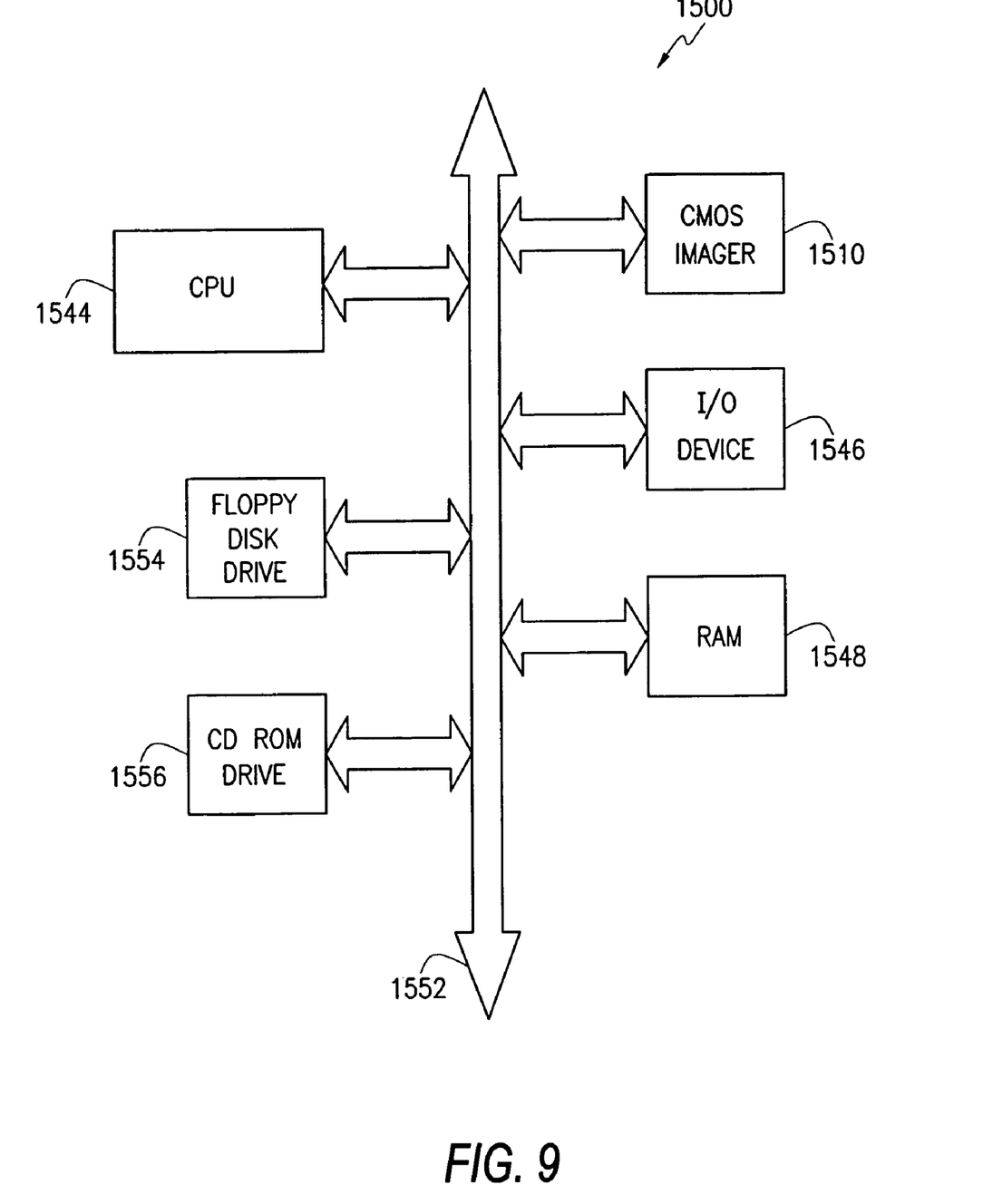
FIG. 9 is an illustration of a computer system having a CMOS imager according to the present invention.

A typical processor system which includes a CMOS imager device having pixels constructed according to the present invention is illustrated generally in FIG. 9. A pixel imager array having pixels constructed as described above may be used in an imager device having associated circuits for reading images captured by the pixel array. The imager device may, in turn, be coupled to a processor system for further image processing.

As can be seen from the process depicted in FIGS. 3A-3C and 3A-3D and in the specific examples, a portion of the implanted photo-diode region 930 which is deeper into substrate 915 extends as much or less towards the transfer gate 940, than a portion of the implanted photodiode region which does not extend as deep into the substrate. This reduces any short channel effect, as well as any associated transfer gate leakage, as compared to the photodiode implant depicted in FIG. 2.

A processor system which uses a CMOS imager having pixels fabricated in accordance with the invention, for example, generally comprises a central processing unit (CPU) 1544 that communicates with an input/output (I/O) device 1546 over a bus 1552. The CMOS imager 1510 also communicates with the system over bus 1552. The computer system 1500 also includes random access memory (RAM) 1548, and, in the case of a computer system may include peripheral devices such as a floppy disk drive 1554 and a compact disk (CD) ROM drive 1556 which also communicate with CPU 1544 over the bus 1552. As described above, CMOS imager 1510 is combined with a pipelined JPEG compression module in a single integrated circuit.

It should again be noted that although the invention has been described with specific reference to CMOS imaging circuits having a photodiode and a floating diffusion, the invention has broader applicability and may be used in forming a photodiode structure adjacent a transfer gate in any CMOS imaging apparatus. For example, the CMOS imager array can be formed on a single chip together with the logic or the logic and array may be formed on separate IC chips. In addition to transfer gates, the configuration is equally applicable to other gates, such as reset gates, global shutter, storage gate, high dynamic range gate, etc. Moreover, the implantation process described above is but one method of many that could be used. The implantation process can further be implemented on a variety of image pixel circuits, including three transistor (3T), four transistor (4T) five transistor (5T), six transistor (6T) or seven transistor (7T) structures. Accordingly, the above description and accompanying drawings are only illustrative of preferred embodiments which can achieve the features and advantages of the present invention. It is not intended that the invention be limited to the embodiments shown and described in detail herein. The invention is only limited by the scope of the following claims.

What is claimed as new and desired to be protected by Letters Patent of the United States is:

1. A method of forming a region in an image sensor comprising:
   forming a semiconductor substrate of a first conductivity type having a surface;
   forming a gate on the surface of the substrate; and
   forming a photosensor configured as a source of said gate, said step of forming a photosensor including forming an implant region within said substrate of a second conductivity type different than said first conductivity type,
   wherein a first portion of said implant region is formed by a first step of implanting ions of said second conductivity type at a first implanting angle other than normal to the surface of the substrate such that said first portion extends further towards a region of said substrate beneath said gate than a second portion of said implant region, said second portion being formed underneath the first portion in the implant region,
   wherein the second portion of said implant region is formed by a second step of implanting ions of said second conductivity type at a second implanting angle other than normal to the surface of the substrate, and
   wherein said second implanting angle is greater than said first implanting angle.

2. The method according to claim 1, wherein the substrate is formed with p-type material, and the implants are formed by n-type materials.

3. The method according to claim 1, wherein the substrate is formed with n-type material, and the implants are formed by p-type materials.

4. The method according to claim 1, wherein an upper portion of said implant region is farther away from the region beneath said gate than other portions of the implant.

5. The method of claim 1, wherein said first portion is formed nearest the substrate surface in the implant region.

6. The method of claim 5, wherein the first portion is formed from an implant energy ranging between 5-200 KeV.

7. The method of claim 1, wherein the second portion is formed from an implant energy ranging between 30-200 KeV.

8. The method of claim 1, wherein said gate includes a gate oxide and a conductor.

9. The method of claim 8, wherein said conductor contains at least one of poly-silicon, silicide, metal, and any combination of poly-silicon, silicide and metal.

10. The method of claim 8, wherein said gate includes an insulator over the conductor.

11. The method of claim 10, wherein the insulator is formed from at least one of oxide, nitride, metal oxide, and any combination of oxide, nitride, and metal oxide.

12. The method of claim 1, wherein a third portion of said implant region is formed by a third step of implanting ions of said second conductivity type at a third implanting angle other than normal to the surface of the substrate, said third step of implanting said ions being performed at a lower dose and lower implant energy than one of said first and second steps of implanting said ions.

13. The method of claim 12, wherein said third step of implanting said ions is performed at a lower dose and higher implant energy than said first step of implanting said ions, and said third step of implanting said ions is performed at a lower dose and lower implant energy than said second step of implanting said ions.

14. A method of forming a region in an image sensor, comprising:
   forming a semiconductor substrate of a first conductivity type having a surface;
   forming a gate on the surface of the substrate;
   forming a storage region configured to store charge received from said gate; and
   forming a photosensor having an implant region within said substrate of a second conductivity type different than said first conductivity type, said implant region being configured to store charge to be transferred to said storage region via said gate,
   wherein a portion of said implant region extends further towards a region of said substrate beneath said gate than at least one other portion of said implant region, said portions of said implant region including at least a first portion, a second portion, and a third portion of said implant region,
   wherein the forming of the implant region includes forming said first portion nearest the substrate surface in the implant region,
   wherein the forming of the implant region includes forming said second portion underneath the first portion in the implant region,
   wherein the forming of the implant region includes forming said third portion,
   wherein at least two of the first, second, and third implant portions are formed via steps of implanting ions of said second conductivity type at implanting angles greater than zero degrees with respect to the semiconductor substrate,
   wherein an implanting angle of said second implant portion is greater than an implanting angle of said first implant portion, and
   wherein an implanting angle of said third implant portion is greater than an implanting angle of said second implant portion.

15. The method of claim 14, wherein the third portion is formed from an implant energy ranging between 60-300 KeV.

16. The method of claim 14, wherein at least one of said first, second, and third portions of the implant region is formed by an implanting angle between 15 and 30 degrees in the direction of the gate, said implanting angle being measured away from a line normal to the surface of the substrate.

17. The method of claim 16, wherein the third portion extends further than the first and second portions towards the region of said substrate beneath said gate.

18. The method of claim 17, wherein the implanting angle for the first and second portions of the implant region is 0-15 degrees, and the implanting angle for the third portion is 0-30 degrees.

19. The method of claim 14, wherein the second portion extends further than the first portion towards the region of said substrate beneath said gate.

20. The method of claim 19, wherein the implanting angles for the first, second, and third portions of the implant region are 0-15 degrees, 0-30 degrees, and 0-30 degrees, respectively.

21. The method of claim 14, wherein the forming of the implant region includes a fourth portion, said fourth portion being lateral to the second portion in the direction of the gate.

22. The method of claim 21, wherein the fourth portion is formed from an implant energy ranging between 50-150 KeV.

23. The method of claim 21, wherein the fourth portion extends further than the first, second, and third portions towards the region of said substrate beneath said gate.

24. The method of claim 21, wherein at least one of said first, second, and third portions of the implant region are formed by implants angled between 0 and 10 degrees in the direction of the gate, said angle being measured away from a line normal to the surface of the substrate.

25. The method of claim 24, wherein the implant angle of the fourth portion is between 10 and 30 degrees.

26. The method of claim 1, wherein at least one of said first and second portions of implant region are formed by implants angled between 0-30 degrees in the direction of the gate, said angle being measured away from a line normal to the surface of the substrate.

27. The method of claim 14, wherein at least one of said steps of implanting said ions is performed at a lower dose and lower implanting energy than another one of said steps of implanting said ions.

28. The method of claim 27, wherein said step of forming said third portion is performed at a lower dose and higher implant energy than said step of forming said first portion, and said step of forming said third portion is performed at a lower dose and lower implant energy than said step of forming said second portion.

29. A method comprising:
forming a photodiode comprising steps of:
implanting a first plurality of ions of a first conductivity type into a first region of a semiconductor substrate of a second conductivity type different than said first conductivity type at a first implanting angle and a first energy level;
implanting a second plurality of ions of said first conductivity type into a second region of said substrate at a second implanting angle and a second energy level, said second portion being formed underneath the first portion in the implant region; and
implanting a third plurality of ions of said first conductivity type into a third region of said substrate at a third implanting angle and a third energy level,
wherein said first, second, and third implanting angles are within the range of about 5 to about 30 degrees from normal,
wherein at least one of said first, second, or third energy levels is not equal to the other energy levels,
wherein said second implanting angle is greater than said first implanting angle, and
wherein said third implanting angle is greater than said second implanting angle.

30. The method of claim 29, wherein said first energy level is lower than said second and third energy levels.

31. The method of claim 30, wherein said first energy level is in the range of about 5 to about 100 KeV.

32. The method of claim 31, wherein the second energy level is within the range of about 50 to about 250 KeV.

33. The method of claim 32, wherein the third energy level is within the range of about 100 to about 400 KeV.

34. The method of claim 33, further comprising the act of implanting a fourth plurality of ions of said first conductivity type into a fourth region of said substrate, adjacent one of said second or third region.

35. The method of claim 29, further comprising the act of implanting a first plurality of second conductivity-type ions into said substrate.

36. The method of claim 29, wherein at least one of said steps of implanting at implanting angles is performed at a lower dose and lower implanting energy than another one of said steps of implanting at implanting angles.

37. The method of claim 36, wherein said step of implanting said third plurality of ions is performed at a lower dose and higher implanting energy than said step of implanting said first plurality of ions, and said step of implanting said third plurality of ions is performed at a lower dose and lower implanting energy than said step of implanting said second plurality of ions.

38. A method comprising:
forming a photodiode comprising steps of:
implanting a first plurality of ions of a first conductivity type into a first region of a semiconductor substrate of a second conductivity type different than said first conductivity type at a first implanting angle and a first energy level;
implanting a second plurality of ions of said first conductivity type into a second region of said substrate at a second implanting angle and a second energy level;
implanting a third plurality of ions of said first conductivity type into a third region of said substrate at a third implanting angle and a third energy level; and
implanting a first plurality of second conductivity-type ions into said substrate,
wherein said first, second, and third angles are within the range of about 5 to about 30 degrees from normal,
wherein at least one of said first, second, or third energy levels is not equal to the other energy levels, and
wherein said first plurality of second conductivity-type ions are implanted into a region of said substrate above said first, second, and third regions.

39. A method comprising:
forming a photodiode comprising steps of:
implanting a first plurality of ions of a first conductivity type into a first region of a semiconductor substrate of a second conductivity type different than said first conductivity type at a first implanting angle and a first energy level;

implanting a second plurality of ions of said first conductivity type into a second region of said substrate at a second implanting angle and a second energy level; and implanting a third plurality of ions of said first conductivity type into a third region of said substrate at a third implanting angle and a third energy level;

wherein said first, second, and third angles are within the range of about 5 to about 30 degrees from normal, wherein at least one of said first, second, or third energy levels is not equal to the other energy levels, and wherein a lower boundary for said first implant region creates an upper boundary for said second implant region, and wherein a lower boundary for said second implant region creates an upper boundary for said third implant region.

40. The method of claim 39, wherein at least one of said first, second, or third implant regions extends farther in a horizontal direction in said substrate than at least one other of said implant regions.

41. A method of forming an image sensor comprising:

forming a gate on a surface of a semiconductor substrate having a second conductivity type different than a first conductivity type; and forming a photosensor having a charge accumulation region which can be depleted of charge by activation of said gate, said forming of said photosensor comprising the acts of:

forming a first implant region by implanting first conductivity type ions into said substrate at a first implanting angle relative to normal, said first conductivity type being different than said second conductivity type, and forming a second implant region by implanting first conductivity type ions into said substrate at a second implanting angle relative to normal, said second portion being formed underneath the first portion in the implant region, wherein said first implant region extends further towards a region of said substrate beneath said gate than said second implant region, both of said first and second implanting angles are greater than 0 degrees, and wherein said second implanting angle is greater than said first implanting angle.

42. The method of claim 41, wherein a lower boundary of said first implant region forms an upper boundary of said second implant region.

43. The method of claim 41, further comprising the act of forming a surface implant region by implanting second conductivity type ions in an area of said substrate above said first and second implant regions.

44. The method of claim 41, wherein said step of forming said first implant region includes implanting said ions at a lower dose and lower implanting energy than said step of forming said second implant region.

45. A method of forming an image sensor, comprising the acts of:

forming a gate on a surface of a semiconductor substrate having a second conductivity type; and forming a photosensor for photogenerating charge, said forming of said photosensor comprising the acts of:

forming a first implant region by implanting first conductivity type ions into said substrate at a first implanting angle relative to normal, forming a second implant region by implanting first conductivity type ions into said substrate at a second implanting angle relative to normal, said second portion being formed underneath the first portion in the implant region, and forming a third implant region by implanting said first conductivity type ions into said substrate at a third implanting angle relative to normal;

wherein said first conductivity type is different than said second conductivity type, wherein a first portion of said second implant region extends further towards a region of said substrate beneath said gate than said first implant region, wherein said first, second, and third implanting angles are greater than 0 degrees, wherein said second implanting angle is greater than said first implanting angle, and wherein said third implanting angle is greater than said second implanting angle.

46. The method of claim 45, further comprising the act of forming a fourth implant region by implanting said first conductivity type ions into said substrate, said fourth implant region being located adjacent one of said second or third implant regions.

47. The method of claim 45, further comprising:

performing a low energy implant at a first energy level of first conductivity type ions into a second conductivity type semiconductor substrate to create said first implant region;

implanting first conductivity type ions into said substrate at a second energy level higher than said first energy level to form said second implant region; and implanting first conductivity type ions into said substrate at a third energy level higher than said first energy level to form said third implant region, wherein said third implant region is located below said first implant region in said substrate and wherein said first conductivity type is different than said second conductivity type.

48. The method of claim 47, wherein said first energy level is in the range of about 5 to about 200 KeV.

49. The method of claim 48, wherein said first energy level is less than 100 KeV.

50. The method of claim 49, wherein the second energy level is in the range of about 50 to about 250 KeV.

51. The method of claim 49, wherein said third energy level is in the range of about 60 to about 500 KeV.

52. The method of claim 51, wherein said third energy level is in the range of about 100 to about 400 KeV.

53. The method of claim 48, wherein said second energy level is in the range of about 30 to about 300 KeV.

54. The method of claim 45, wherein at least one of said steps of implanting said ions is performed at a lower dose and a lower implanting energy than another one of said steps of implanting said ions.

55. The method of claim 54, wherein said step of forming a third implant region is performed at a lower dose and a higher implanting energy than said step of forming a first implant region, and said step of forming a third implant region is performed at a lower dose and a lower implanting energy than said step of forming a second implant region.

* * * * *